United States Patent
Olsen et al.

(10) Patent No.: US 6,552,561 B2
(45) Date of Patent: *Apr. 22, 2003

(54) APPARATUS AND METHOD FOR CONTROLLING TEMPERATURE IN A DEVICE UNDER TEST USING INTEGRATED TEMPERATURE SENSITIVE DIODE

(75) Inventors: Douglas S. Olsen, Natick, MA (US); David Stura, North Billerica, MA (US)

(73) Assignee: Temptronic Corporation, Sharon, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/839,274

(22) Filed: Apr. 20, 2001

(65) Prior Publication Data

US 2002/0050834 A1 May 2, 2002

Related U.S. Application Data

(63) Continuation-in-part of application No. 09/612,667, filed on Jul. 10, 2000.

(51) Int. Cl.[7] .............................................. G01R 31/02
(52) U.S. Cl. ...................... 324/760; 324/73.1
(58) Field of Search ................ 324/73, 158.1, 324/760, 23.1, 762, 763, 765; 62/3.3, 208, 3, 62; 236/78; 700/300, 207; 713/300, 360; 702/130, 132; 165/61, 80.3; 219/209; 374/57, 135

(56) References Cited

U.S. PATENT DOCUMENTS

| | | | | |
|---|---|---|---|---|
| 4,734,872 A | * | 3/1988 | Eager | 700/300 |
| 4,848,090 A | * | 7/1989 | Peters | 62/3.3 |
| 4,955,380 A | * | 9/1990 | Edell | 128/635 |
| 5,123,850 A | * | 6/1992 | Elder | 439/67 |
| 5,154,514 A | | 10/1992 | Gambino et al. | 374/178 |
| 5,205,132 A | * | 4/1993 | Fu | 62/208 |
| 5,281,026 A | | 1/1994 | Bartilson et al. | 374/143 |
| 5,498,971 A | | 3/1996 | Turnbull et al. | 324/760 |
| 5,875,142 A | | 2/1999 | Chevallier | 365/212 |
| 6,279,832 B1 | * | 8/2001 | Duchatelet | 326/78 |

FOREIGN PATENT DOCUMENTS

| | | | |
|---|---|---|---|
| DE | 196 52 046 | 6/1998 | |
| WO | WO 99/34159 | 7/1999 | F25B/29/00 |

* cited by examiner

Primary Examiner—Kamand Cuneo
Assistant Examiner—Trung Nguyen
(74) Attorney, Agent, or Firm—Mills & Onello LLP

(57) ABSTRACT

An apparatus and method for controlling temperature in a device under test (DUT) having an integrated circuit chip die includes a temperature sensing device, such as a temperature sensitive diode, integrally formed in the chip die. A sensing circuit senses a signal from the diode indicative of temperature of the chip die. The sensing circuit can be part of a testing circuit in a system being used to test the DUT. The sensing circuit sends a control signal to a temperature control system used to control the temperature of a DUT temperature control medium. The temperature control medium can be, for example, a stream of temperature-controlled air directed onto the package of the DUT. In response to the control signal, the temperature control system controls the temperature of the air at a desired temperature to control the temperature of the DUT.

25 Claims, 3 Drawing Sheets

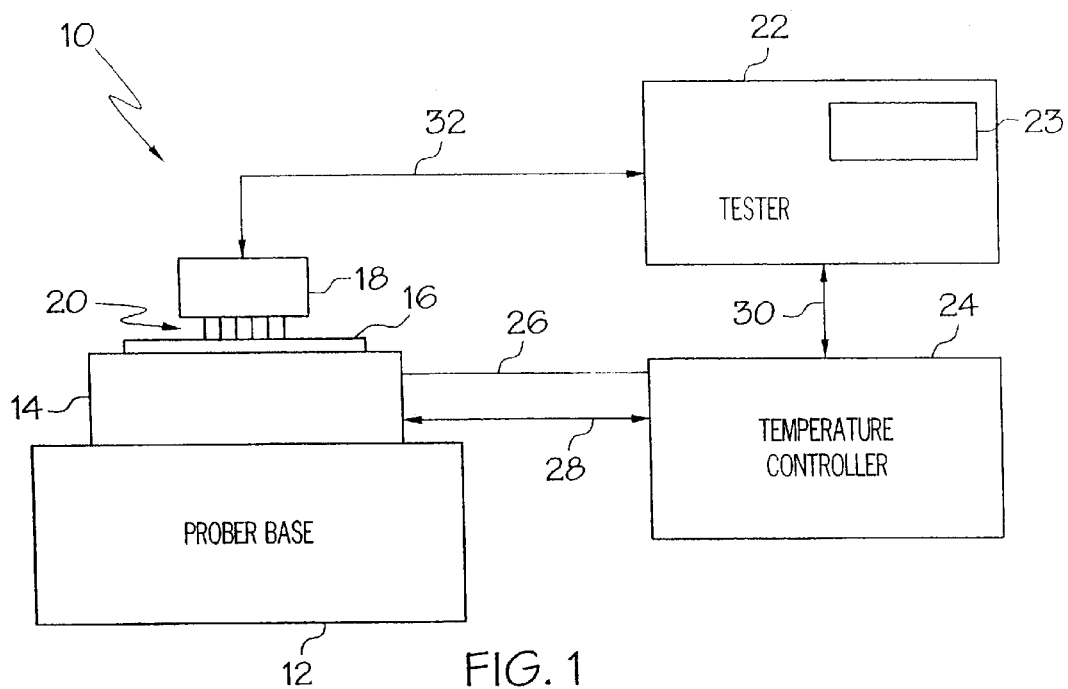
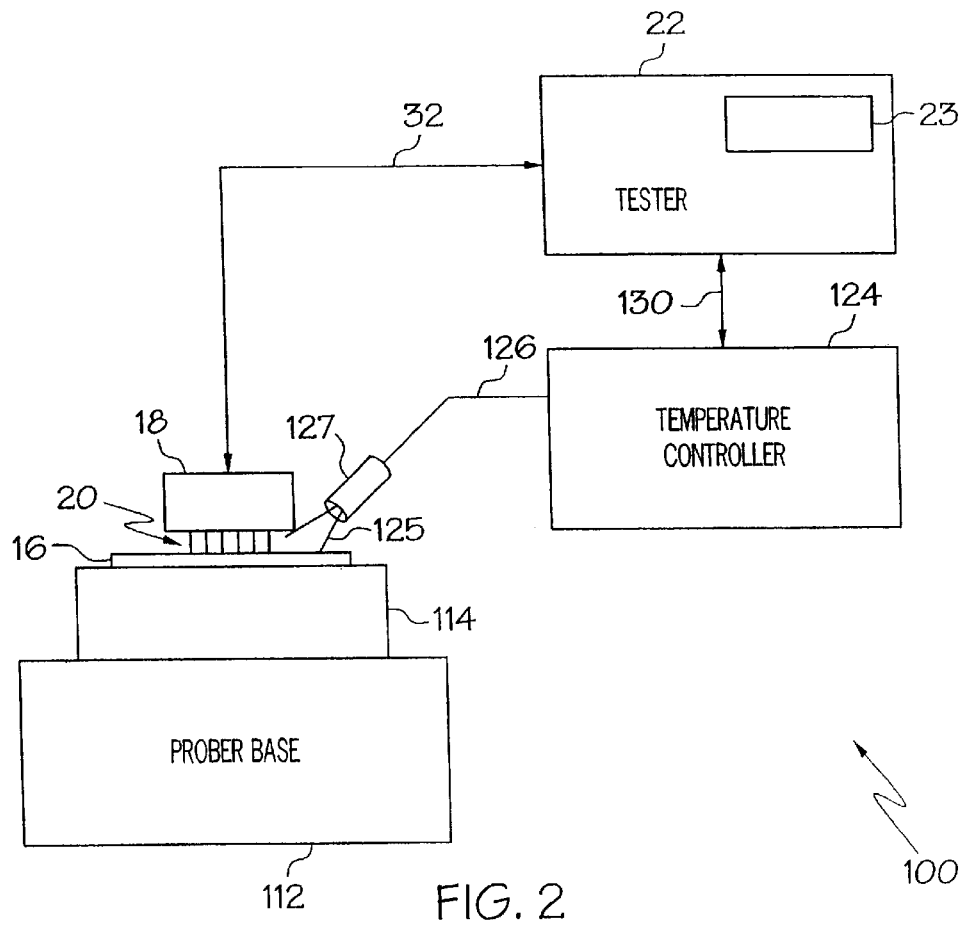

APPARATUS AND METHOD FOR CONTROLLING TEMPERATURE IN A DEVICE UNDER TEST USING INTEGRATED TEMPERATURE SENSITIVE DIODE

RELATED APPLICATIONS

This application is a continuation-in-part of copending U.S. application Ser. No. 09/612,667, filed on Jul. 10, 2000, the contents of which are incorporated herein in their entirety by reference.

FIELD OF THE INVENTION

The present invention relates to integrated circuit device testing and in particular to controlling temperature in a device under test (DUT) during testing.

BACKGROUND OF THE INVENTION

Typically, in integrated circuit (IC) processing, semiconductor wafers and packaged ICs are subjected to a series of test and evaluation steps. For each step, the wafer or packaged circuit device under test (DUT) is held in a stationary position at a process station where the process is performed. In wafer testing, the wafer is typically held stationary relative to a vacuum support surface of a prober machine which electrically tests the circuits on the wafer. The prober includes a group of electrical probes in a probe head which is positioned such that the probes are brought into contact with predetermined contact points on individual circuits formed in the wafer. The probes, in conjunction with a tester, apply predetermined electrical excitations to various predetermined portions of the circuits on the wafer and sense the circuits' responses to the excitations. In packaged IC testing, the IC is typically held in a test socket mounted on a test board. The electrical stimulus signals are applied to the DUT and response signals are received via the socket and the test board.

The test system used to test a wafer or a packaged device can also include a temperature control system which maintains the temperature of the wafer or DUT at a desired set point temperature. Temperature control systems for a wafer can take several forms. For example, the chuck can be outfitted with electrical heaters which are controlled to provide heat to the chuck and raise the temperature of the wafer. The chuck can also include a heat sink for removing heat from the chuck. The temperature control system can also include a means for circulating a fluid through the chuck to cool and/or heat the chuck.

In wafer testing the set point temperature of the chuck is selected based on a desired testing temperature for the wafer. The chuck typically includes a temperature sensor mounted within the chuck in close proximity to its top surface and, therefore, the wafer mounted thereon. Since the temperature sensor is located close to the wafer, it is assumed that the temperature at the top surface of the chuck is the same as the temperature of the wafer circuit being tested and that any difference in temperature between the two is negligible.

In many modern circuit testing settings, this assumption can lead to inaccurate testing results. For example, in many circuits, power dissipation is relatively high. This results in substantial localized heating of the circuit or adjacent circuits when the circuit testing excitation signal is applied by a tester operating with the prober. The result is that the circuit is actually tested at a much higher temperature than the temperature set by the system, and the accuracy of the test is reduced.

In a system for testing packaged ICs, the temperature control system can provide a temperature-controlled stream of fluid or gas, e.g., air, directed onto the DUT package. An example of such a system is the ThermoStream system sold by Temptronic Corporation of Newton, Mass., the assignee of the present application. The temperature control used in the ThermoStream system is described in U.S. Pat. No. 4,734,872, assigned to Temptronic Corporation, the assignee of the present application, and incorporated herein in its entirety by reference. In the ThermoStream system, the set point temperature of the DUT is maintained by simultaneously monitoring the temperature of the air stream and the temperature of the DUT package. In many applications, even with the temperature probe on the package, some level of inaccuracy, albeit small, can be introduced.

It would be beneficial to have a temperature control system for controlling the temperature of a wafer or device under test in which temperature sensing is realized at the actual circuit being tested.

SUMMARY OF THE INVENTION

The present invention is directed to an apparatus and method for controlling the temperature of a device under test (DUT) having an integrated circuit chip die which overcomes the drawbacks of the prior art. The apparatus of the invention includes a temperature sensing device integrally formed in the integrated circuit chip die. A sensing circuit receives from the temperature sensing device a signal indicative of temperature of the integrated circuit chip die. A temperature control medium is in thermal communication with the DUT. The temperature of the temperature control medium is controlled by a temperature control system. The temperature control system uses the signal indicative of the temperature of the integrated circuit chip die to control the temperature of the temperature control medium such that the temperature of the integrated circuit chip die is controlled.

In one embodiment, the temperature control medium is a stream of a temperature-controlled gas such as air which is directed onto the DUT. The temperature control system controls the temperature of the air to control the temperature of the DUT.

The temperature sensing device formed in the integrated circuit chip die can be a temperature-sensitive diode. The diode is formed in the chip along with the other circuitry. An excitation current can be driven through the diode by the DUT testing system, and the resulting voltage drop across the diode can be sensed. In such a diode, the voltage drop across the diode changes with temperature. Therefore, the sensed voltage drop can be used to generate the signal indicative of temperature of the integrated circuit chip die.

The DUT can be a packaged integrated circuit with an internal chip die. The device can include conductive pins which provide the interface between the internal circuitry and external devices and systems.

In one embodiment, the sensing circuit can be part of a testing circuit in a system used to test the DUT. To test the device, the testing circuit applies test stimulus signals to the DUT, and receives test response signals from the DUT, via the package pins. The testing circuit can be coupled to the temperature control system. The signal indicative of temperature of the integrated circuit chip die, received via one or more package pins, is used to generate a control signal which is applied to the temperature control system and is used by the temperature control system to control the temperature of the temperature control medium, e.g., the air stream.

In one embodiment, the temperature control process used in the invention directly controls the temperature of the temperature control medium, i.e., air stream, to control the temperature of the DUT. That is, in the air stream system, the temperature of the air stream is sensed, and the sensed temperature is used to control the temperature of the air stream to maintain it at a desired set point. If the air stream temperature is at its set point and the diode output signal does not indicate that the DUT is at its desired set point temperature, then a new air stream set point is selected. This continues until the desired temperature is reached. Hence, the set point for the temperature control medium, i.e., air stream, is in general different than the set point for the DUT.

This type of control can be regarded as a "dual-loop" control in which two types of feedback are used to achieve the ultimate desired output. Such dual-loop temperature control, which can be used in accordance with one embodiment of the invention, is described in, for example, U.S. Pat. No. 4,734,872, entitled, "Temperature Control for Device Under Test," issued Mar. 29, 1988, assigned to Temptronic Corporation, and incorporated herein in its entirety by reference.

The temperature control approach used in accordance with the invention is used to precisely control the temperature of the device being tested, with temperature sensing being realized at the circuit under test, not at a relatively remote location. As a result, the temperature control tests performed in connection with the temperature control of the invention are more accurate than tests performed using prior approaches to temperature control.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 1 is a schematic block diagram of a wafer testing system using temperature control in accordance with the invention.

FIG. 2 is a schematic block diagram of another wafer testing system using temperature control in accordance with the invention.

DETAILED DESCRIPTION OF PREFERRED EMBODIMENTS OF THE INVENTION

Figure 3:
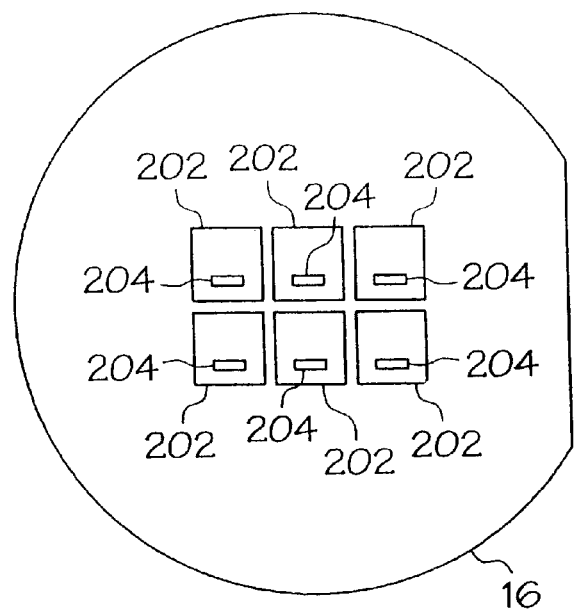
FIG. 3 is a schematic plan view of an integrated circuit wafer having multiple integrated circuits formed with integral temperature sensing diodes, for use with the temperature control apparatus and method of the invention.

FIG. 1 is a schematic block diagram of a circuit testing system, particularly a wafer probing system 10, which includes the temperature control apparatus and method of the invention. The system 10 includes a prober base 12 on which is mounted a temperature-controlled wafer chuck 14 used to support a wafer under test 16 during testing. The chuck 14 can be of the types described in U.S. Pat. No. 6,019,164, issued Feb. 1, 2000, entitled, "Workpiece Chuck," assigned to Temptronic Corporation, and incorporated herein in its entirety by reference; U.S. Pat. No. 6,073,681, issued Jun. 13, 2000, entitled, "Workpiece Chuck," assigned to Temptronic Corporation, and incorporated herein in its entirety by reference; and copending U.S. patent application Ser. No. 09/473,099, filed on Dec. 28, 1999, entitled, "Workpiece Chuck," assigned to Temptronic Corporation, and incorporated herein in its entirety by reference.

The temperature of the chuck 14 is controlled by temperature controller 24 via an electrical interface generally identified by reference numeral 28 and a thermal interface identified by reference numeral 26. The thermal interface 26 can include, for example, tubes for circulating a temperature-controlled fluid through the chuck 14. The electrical interface can be used, for example, to provide power to heaters in the chuck 14. The temperature of the chuck 14 can be controlled in accordance with copending U.S. patent application Ser. No. 09/001,887, filed on Dec. 31, 1997, entitled, "Temperature Control System for a Workpiece Chuck," assigned to Temptronic Corporation, and incorporated herein in its entirety by reference.

The prober includes a tester circuit 22 which controls a test head 18 which physically interfaces with circuits on the wafer 16 via a set of prober pins or probes 20. The tester 22 applies test stimulus signals to the circuit under test and receives response signals via the pins 20 in the test head 18 and the interface generally identified by reference numeral 32.

FIG. 3 is a schematic top plan view of the wafer 16. As shown in FIG. 3, the wafer 16 includes multiple integrated circuits 202 formed in the wafer by known integrated circuit fabrication processes. Each circuit 202 also includes a temperature sensing device, such as a temperature sensitive diode 204, formed integrally in the wafer 16 with the circuits 202. These diodes 204 can be formed at the same time as the circuits 202 as part of the circuit fabrication process, or they can be formed in a separate fabrication process. The diodes 204 operate such that, during operation, as they conduct current, the voltage drop across them varies with temperature in a known and characterized fashion. Hence, a measurement of the voltage drop across the diode 204 can be used to determine the temperature of the diode 204 and, therefore, its respective associated circuit 202 under test.

Referring again to FIG. 1, the tester 22 applies the test stimulus signals to a particular circuit under test on the wafer 16. The response signals are received and processed by the tester 22. The tester 22 includes a temperature testing circuit 23 which receives and processes the signal from the temperature sensitive diode 204 in the circuit 202 under test. The signal is processed and a resulting control signal is generated and applied to the temperature controller 24. The signal processed by the circuit 23 is indicative of the temperature of the circuit 202 under test. The control signal sent to the temperature controller 24 is used to select the set point temperature for the chuck to adjust the chuck temperature until the signal processed by the circuit 23 indicates that the circuit 202 under test is at the desired set temperature.

This approach is referred to herein as a "dual-loop" control approach. A first control loop is used to control the temperature of the chuck 14 to maintain the chuck temperature at the desired chuck set point temperature. The second loop is used to control the set point temperature of the chuck 14 such that the desired wafer circuit temperature is maintained. Such a dual-loop temperature control is described in U.S. Pat. No. 4,734,872, cited above and incorporated herein in its entirety by reference.

FIG. 2 is a schematic block diagram of another circuit test system 100 which implements the temperature control approach of the invention. In this embodiment, instead of controlling the temperature of the chuck 114 on which the wafer 16 is mounted, a stream of temperature-controlled gas 125 is directed onto the wafer 16 by a nozzle 127 and gas tube 126 from a gas temperature controller 124. The stream type temperature control system can be of the type described in U.S. Pat. No. 4,734,872 cited above and incorporated herein in its entirety by reference.

In accordance with the dual-loop control approach, the temperature controller 124 maintains the temperature of the gas at a set point temperature. If the signal processed by the circuit 23 indicates that the circuit 202 under test is not at its desired temperature, a control signal sent to the temperature controller 124 selects a new set point. This process continues until the circuit under test is maintained at the desired temperature.

Figure 4:
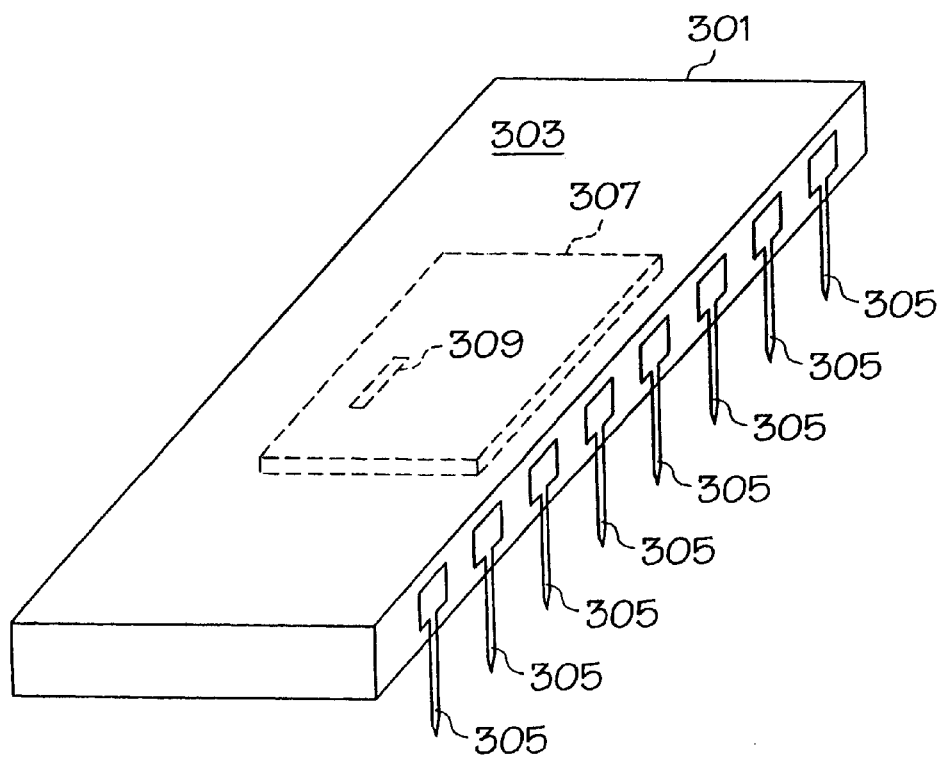
FIG. 4 contains a schematic perspective view of a packaged integrated circuit device under test to which the invention is applicable.

In another aspect, the invention is used to control the temperature of a device under test (DUT) which can be, for example, a packaged integrated circuit. FIG. 4 contains a schematic perspective view of a packaged integrated circuit 301 to which the invention is applicable. The DUT 301 includes and integrated circuit chip die 307 inside an integrated circuit package 303. The interface between the chip die circuits 307 and external circuits and systems is provided via conductive pins 305. The devices fabricated on the chip die 307 include the temperature-sensitive diode.309. The diode 309 is also interfaced to external circuitry via pins 305.

Figure 5:
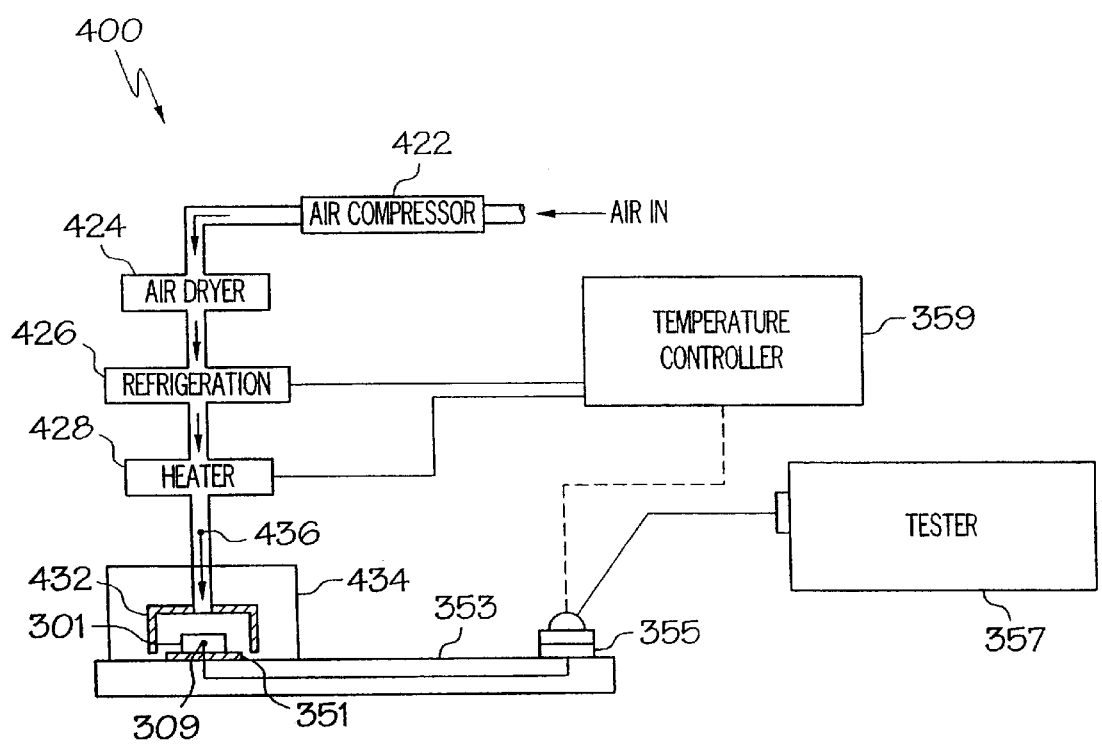
FIG. 5 contains a schematic block diagram of one embodiment of an integrated circuit testing system to which the invention is applicable.

FIG. 5 contains a schematic block diagram of one embodiment of an integrated circuit testing system 400 to which the invention is applicable. The testing system can be, for example, the ThermoStream system sold by Temptronic Corporation of Newton, Mass., the assignee of the present application, modified to stimulate and process the signals generated by the integrated temperature-sensitive diode 309 to control the temperature of the DUT 301 in accordance with the invention. The testing system and temperature control used in the invention can be of the type described in U.S. Pat. No. 4,734,872, incorporated herein by reference, once again, modified to stimulate and process the signals generated by the integrated temperature-sensitive diode 309 to control the temperature of the DUT 301 in accordance with the invention.

As shown in FIG. 5, the test system 400 includes a gas (air) inlet which receives the gas whose temperature is to be controlled. An air dryer 424 lowers the dew point of the air to prevent condensation, and refrigeration 426 and heating 428 are used to control the temperature of the gas under the control of the temperature controller 359. The air temperature sensor 436 senses the temperature of the air and provides a signal indicative of the air temperature, which is used by the temperature controller 359 to control the temperature of the air via the refrigeration 426 and heating 428. The temperature-controlled air is directed onto the DUT 301 to control its temperature.

The DUT 301 is mounted in a socket 351 which is mounted on a circuit board 353. Stimulus and response test signals between the tester 357 and the DUT 301 are routed from the DUT 301, through the circuit board 353 and to the tester 357 via a board-mounted connector 355. These signals include the signals at the temperature-sensitive diode 309 formed integrally within the chip die in the DUT 301. The tester applies the test stimulus signals and receives the test response signals used to test the DUT 301. The tester 357 also routes the signal indicative of the DUT temperature from the diode 309 to the temperature controller 359. The temperature controller 359 uses the temperature of the DUT 301 and the air to maintain the DUT 301 at the desired temperature set point. This can be done using the dual-loop control described above and in U.S. Pat. No. 4,734,872, incorporated herein by reference.

Referring to FIG. 5, a tester 357 can be used as described above but is not required. The temperature controller 359 can apply the test stimulus and receive test response signals directly as shown by the dashed line.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. An apparatus for controlling temperature of at least a portion of a device under test (DUT), the device under test including an integrated circuit chip die, the apparatus comprising:

an integral temperature sensing device integrally fabricated within the integrated circuit chip die;

a sensing circuit for receiving a signal from the temperature sensing device indicative of temperature of the integrated circuit chip die;

a temperature control medium in thermal communication with the DUT;

a temperature control system for controlling temperature of the temperature control medium, the temperature control system using the signal indicative of temperature of the integrated circuit chip die to control the temperature of the temperature control medium such that the temperature of integrated circuit chip die is controlled.

2. The apparatus of claim 1, wherein the DUT is a packaged integrated circuit including a package which houses the integrated circuit chip die.

3. The apparatus of claim 2, wherein a test stimulus signal is applied to the integrated circuit chip die via a pin on the package.

4. The apparatus of claim 2, wherein a test response signal is received from the integrated circuit chip die via a pin on the package.

5. The apparatus of claim 2, wherein the signal indicative of temperature of the integrated circuit chip die is received from the integrated circuit chip die via a pin on the package.

6. The apparatus of claim 1, wherein the temperature sensing device is a temperature sensitive diode fabricated within the integrated circuit chip die.

7. The apparatus of claim 1, wherein the sensing circuit is part of a testing circuit used to test the integrated circuit chip die.

8. The apparatus of claim 7, wherein the testing circuit applies a test stimulus signal to the integrated circuit chip die via a pin on a package of the DUT.

9. The apparatus of claim 7, wherein the testing circuit receives a test response signal from the integrated circuit chip die via a pin on a package of the DUT.

10. The apparatus of claim 7, wherein the testing circuit is coupled to the temperature control system, the testing circuit using the signal indicative of temperature of the integrated circuit chip die to generate a control signal applied to the temperature control system and used by the temperature control system to control the temperature of the temperature control medium.

11. The apparatus of claim 10, wherein the control signal is used by the temperature control system to set the temperature of the temperature control medium at a first temperature set point such that the temperature of the integrated circuit chip die is controlled at a second chip die temperature set point.

12. The apparatus of claim 1, wherein the signal indicative of temperature of the integrated circuit chip die is received from the integrated circuit chip die via a pin on a package of the DUT.

13. The apparatus of claim 1, wherein the temperature control medium is a temperature-controlled stream of gas directed onto the DUT.

14. The apparatus of claim 13, wherein the gas is air.

15. A method of controlling temperature of at least a portion of device under test (DUT), the device under test including an integrated circuit chip die, the method comprising:
   integrally forming a temperature sensing device within the integrated circuit chip die;
   receiving a signal from the temperature sensing device indicative of temperature of the integrated circuit chip die;
   providing a temperature control medium in thermal communication with the DUT;
   using the signal indicative of temperature of the integrated circuit chip die, controlling temperature of the temperature control medium such that the temperature of the integrated circuit chip die is controlled.

16. The method of claim 15, wherein the DUT is a packaged integrated circuit including a package which houses the integrated circuit chip die.

17. The method of claim 16, further comprising applying a test stimulus signal to the integrated circuit chip die via a pin on the package.

18. The method of claim 16, further comprising receiving a test response signal from the integrated circuit chip die via a pin on the package.

19. The method of claim 16, further comprising receiving the signal indicative of temperature of the integrated circuit chip die from the integrated circuit chip die via a pin on the package.

20. The method of claim 15, wherein the temperature control medium is a temperature-controlled stream of gas directed onto the DUT.

21. The method of claim 20, wherein the gas is air.

22. The method of claim 15, wherein integrally forming the temperature sensing device within the integrated circuit chip die comprises integrally forming a temperature sensitive diode within the integrated circuit chip die.

23. The method of claim 15, wherein the signal indicative of temperature in the integrated circuit chip die is received by a sensing circuit in a testing circuit used to test the integrated circuit chip die.

24. The method of claim 23, further comprising:
   coupling the testing circuit to the temperature control system;
   with the testing circuit, using the signal indicative of temperature of the integrated circuit chip die, generating a control signal and applying the control signal to the temperature control system, the temperature control system using the control signal to control the temperature of the temperature control medium.

25. The method of claim 24, wherein the control signal is used by the temperature control system to set the temperature of the temperature control medium at a first temperature set point such that the temperature of the integrated circuit chip die is controlled at a second chip die temperature set point.

* * * * *